United States Patent
Wang et al.

(10) Patent No.: US 10,128,227 B2
(45) Date of Patent: Nov. 13, 2018

(54) ESD PROTECTION DEVICE AND METHOD FOR MANUFACTURING THE SAME

(71) Applicant: Silergy Semiconductor Technology (Hangzhou) Ltd., Hangzhou (CN)

(72) Inventors: Shijun Wang, Hangzhou (CN); Fei Yao, Hangzhou (CN); Dengping Yin, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/671,816

(22) Filed: Aug. 8, 2017

(65) Prior Publication Data

US 2018/0047717 A1    Feb. 15, 2018

(30) Foreign Application Priority Data

Aug. 15, 2016    (CN) .......................... 2016 1 0671655

(51) Int. Cl.
  *H01L 27/082*    (2006.01)
  *H01L 27/102*    (2006.01)
  (Continued)

(52) U.S. Cl.
  CPC ........ *H01L 27/0248* (2013.01); *H01L 21/761* (2013.01); *H01L 21/76224* (2013.01); (Continued)

(58) Field of Classification Search
  CPC .................................................. H01L 27/0761
  See application file for complete search history.

(56) References Cited

U.S. PATENT DOCUMENTS 9,548,292 B2    1/2017  Otake et al.
9,911,730 B2    3/2018  Yao et al.
          (Continued)

FOREIGN PATENT DOCUMENTS

CN    103022030 A    4/2013
CN    105261616 A    1/2016
          (Continued)

OTHER PUBLICATIONS

Office Action, including Search Report, for Chinese Patent Application No. 201610671655.0, dated Aug. 28, 2018, 7 pages.

*Primary Examiner* — Thien F Tran
(74) *Attorney, Agent, or Firm* — Westman, Champlin & Koehler, P.A.

(57) ABSTRACT

Disclosed is a method for manufacturing an ESD protection device. The ESD protection device includes a rectifier diode and an open-base bipolar transistor, the anode of the rectifier diode is the first doped region and the cathode of the rectifier diode is the semiconductor substrate, the emitter region, base region and collector region of the open-base bipolar transistor are the second doped region, the epitaxial semiconductor layer and semiconductor substrate, respectively, the first doped region and the second doped region extend through the doped region into the epitaxial semiconductor layer by a predetermined depth. The doped region can suppress the induced doped region around the second doped region, so that the parasitic capacitance of the open-base bipolar transistor is reduced and the response speed is improved.

24 Claims, 7 Drawing Sheets

(51) Int. Cl.
*H01L 29/70* (2006.01)
*H01L 31/11* (2006.01)
*H01L 27/02* (2006.01)
*H01L 21/761* (2006.01)
*H01L 21/762* (2006.01)
*H01L 21/8222* (2006.01)
*H01L 27/06* (2006.01)
*H01L 29/06* (2006.01)
*H01L 27/07* (2006.01)

(52) U.S. Cl.
CPC ...... *H01L 21/8222* (2013.01); *H01L 27/0259* (2013.01); *H01L 27/0664* (2013.01); *H01L 27/0761* (2013.01); *H01L 29/0615* (2013.01); *H01L 29/0649* (2013.01)

(56) References Cited

U.S. PATENT DOCUMENTS

| | | |
|---|---|---|
| 2005/0212052 A1 | 9/2005 | Yach et al. |
| 2013/0075866 A1 | 3/2013 | Otake et al. |
| 2017/0345811 A1* | 11/2017 | Yin .................... H01L 27/0248 |

FOREIGN PATENT DOCUMENTS

| | | |
|---|---|---|
| CN | 106057781 A | 10/2016 |
| CN | 106558543 A | 4/2017 |

* cited by examiner

ESD PROTECTION DEVICE AND METHOD FOR MANUFACTURING THE SAME

CROSS-REFERENCE TO RELATED APPLICATION

This application claims the benefit of Chinese Patent Application No. 201610671655.0, filed on Aug. 15, 2016, which is incorporated herein by reference in its entirety.

BACKGROUND OF THE DISCLOSURE

Field of the Disclosure

The present disclosure relates to a semiconductor device and a method for manufacturing the same, and in particular, to an electrostatic discharge (ESD) protection device and a method for manufacturing the ESD protection device.

Background of the Disclosure

Electrostatic discharge (ESD) is a phenomenon that releases and transfers charges between integrated circuit chips and external objects. Due to a large amount of charges being released in a short time, the energy from ESD is much higher than the bearing capacity of the chip, which may result in a temporary functional failure or even a permanent damage to the chip. During the process for manufacturing a chip, a wrist strap or an anti-static clothing can be used to reduce the damage from ESD. The chip having been manufactured is easily affected by ESD events between the chip and the external objects when the chip is used in various different environments. Therefore, an ESD protection device is provided in the chip to offer an electrostatic discharge path to protect the chip effectively, so that the reliability and service life of the integrated circuit chip is improved.

In modern electronic products such as smartphones, laptops, tablets and LED displays, ESD protection devices are widely used for providing protection to high-speed data ports mounted on printed circuit boards (PCBs), such as HDMI, USB, DVI, etc. These ESD protection devices are either separate devices or integrated into the chip. In order to protect the high-speed data ports, the ESD protection devices should have high response speed. The response speed of the ESD protection device is mainly influenced by its own capacitance. In order to improve the response speed, the capacitance of the ESD protection device is preferably set to be less than 0.5 pF. Further, the ESD protection device should also have a high electrostatic discharge capability.

The ESD protection device can be implemented based on various circuit structures. FIG. 1 shows a schematic circuit structure of an ESD protection device. The ESD protection device includes an open-base bipolar transistor DT and a rectifier diode D1 coupled in parallel between an input-output terminal I/O and the ground GND. The input-output terminal I/O is, for example, a terminal of high-speed data port. The open-base bipolar transistor DT is an open base NPN triode. When the ESD protection device is turned off, the input-output terminal I/O is used to transfer data. When electrostatic charges are released, the open-base bipolar transistor DT is turned on in the direction from the input-output terminal I/O to the ground GND, or the rectifier diode D1 is turned on in the direction from the ground GND to the input-output terminal I/O, thereby providing an electrostatic discharge path.

FIG. 2 shows an equivalent circuit of the parasitic capacitance of the ESD protection device shown in FIG. 1. In the ESD protection device, the base-emitter junction of the open-base bipolar transistor DT can be equivalent to a rectifier diode, and the base-collector junction can be equivalent to a Zener diode. The parasitic capacitance of the rectifier diode D1 is denoted as C1, the capacitance of the base-emitter junction in the open-base bipolar transistor DT is denoted as C2, and the capacitance of the base-collector junction is denoted as CZ. In order to obtain low application voltages, such as 12V, 8V, 5V, 3.3V and so on, the doping concentration and the junction area of the base-collector junction are increased so that the parasitic capacitance CZ of the open-base bipolar transistor DT is greatly larger than C2.

Further, since the open-base bipolar transistor DT and the rectifier diode D1 are coupled in parallel with each other, the parasitic capacitors C2 and CZ of the open-base bipolar transistor DT are coupled in series, and the equivalent capacitance $C_{(I/O-GND)}$ of the ESD protection device is approximately equal to (C1+C2). That is, the equivalent capacitance of the ESD protection device is mainly determined by the parasitic capacitance C1 of the rectifier diode D1 and the equivalent capacitance C2 of the open-base bipolar transistor DT.

However, the conventional manufacturing method introduces an induced doped region in the open-base bipolar transistor DT, so that the equivalent capacitance C2 of the open-base bipolar transistor DT is also increased. It is desirable to further improve the manufacturing method of the ESD protection device to improve the response speed of the ESD protection device.

SUMMARY OF THE DISCLOSURE

In view of this, there is provided an ESD protection device and a method for manufacturing the same, the parasitic capacitance of the ESD protection device is reduced by forming an additional doped layer.

According to a first aspect of the disclosure, there is provided an ESD protection device, comprising: a semiconductor substrate with a first doping type; a buried layer, a surface of which is at least partly exposed on a surface of the semiconductor substrate, wherein the buried layer is of a second doping type opposite to the first doping type; an epitaxial semiconductor layer located on the semiconductor substrate and the buried layer, and being spaced apart into a first portion and a second portion, wherein the first portion of the epitaxial semiconductor layer is of one of the first doping type and the second doping type, the second portion is of the second doping type; a first doped region located in the first portion of the epitaxial semiconductor layer, wherein the first doped region is of the second doping type; a second doped region located in the second portion of the epitaxial semiconductor layer, wherein the second doped region is of the first doping type; and a doped layer located around the second doped region, wherein the doped layer is of the second doping type, the ESD protection device comprises a rectifier diode and an open-base bipolar transistor, the first doped region is an anode of the rectifier diode and the semiconductor substrate is a cathode of the rectifier diode, the second doped region, the epitaxial semiconductor layer and the semiconductor substrate are an emitter region, a base region and a collector region of the open-base bipolar transistor, respectively, the first doped region and the second doped region extend through the doped layer into the epitaxial semiconductor layer by a predetermined depth.

Preferably, the first portion of the epitaxial semiconductor layer contacts the surface of the semiconductor substrate, and the second portion of the semiconductor layer contacts the surface of the buried layer.

Preferably, the first portion of the epitaxial semiconductor layer is of the first doping type, and the cathode of the rectifier diode comprises the first portion of the epitaxial semiconductor layer.

Preferably, the first portion of the epitaxial semiconductor layer is of the second doping type, and the anode of the rectifier diode comprises the first portion of the epitaxial semiconductor layer.

Preferably, the base region of the open-base bipolar transistor further comprises the buried layer.

Preferably, the ESD protection device further comprises: an interlayer dielectric layer on the doped layer.

Preferably, the doped layer contacts the interlayer dielectric layer.

Preferably, the doped layer has a doping concentration higher than that of the epitaxial semiconductor layer.

Preferably, the doping concentration of the doped layer is within a range of 1e12~5e15 $cm^{-3}$.

Preferably, the ESD protection device further comprises an extension ring surrounding the second doped region and being spaced from the second doped region, and the extension ring is of the first doping type.

Preferably, the extension ring extends through the doped layer into the epitaxial semiconductor layer by a predetermined depth.

Preferably, the ESD protection device further comprises: an isolation structure which extends from a surface of the epitaxial semiconductor layer into the semiconductor substrate so as to divide the epitaxial semiconductor layer into the first portion and the second portion.

Preferably, the isolation structure is a doped region with a first doping type or an isolating trench.

Preferably, the first doping type is one of N-type and P-type, and the second doping type is the other of N-type and P-type.

According to a second aspect of the disclosure, there is provided a method for manufacturing the ESD protection device, comprising: forming a buried layer in the semiconductor substrate, wherein the semiconductor substrate and the buried layer are respectively of a first doping type and a second doping type, the first doping type is opposite to the second doping type; forming an epitaxial semiconductor layer on the semiconductor substrate and the buried layer, wherein a first portion of the epitaxial semiconductor layer is one of the first doping type and the second doping type, and a second portion of the epitaxial semiconductor layer is of the second doping type; forming a first doped region in the first portion of the epitaxial semiconductor layer, wherein the first doped region is of the second doping type; forming a second doped region in the second portion of the epitaxial semiconductor layer, wherein the second doped region is of the first doping type; spacing the first portion and the second portion of the epitaxial semiconductor layer from each other; and forming a doped layer around the epitaxial semiconductor layer, wherein the doped layer is located around the second doped region and is of the second doping type; and the first doped region and the second doped region extend through the doped layer into the epitaxial semiconductor layer by a predetermined depth.

Preferably, the step of forming the epitaxial semiconductor layer comprises forming the epitaxial semiconductor layer with the second doping type by epitaxial growth.

Preferably, the step of forming the epitaxial semiconductor layer comprises:

forming the epitaxial semiconductor layer with the first doping type by epitaxial growth; and self-doping the second portion of the epitaxial semiconductor layer by using the buried layer so as to convert the second portion of the epitaxial semiconductor layer into the second doping type.

Preferably, the method further comprises: forming an interlayer dielectric layer on the doped layer.

Preferably, the doped layer contacts the interlayer dielectric layer.

Preferably, the doped layer has a doping concentration higher than that of the epitaxial semiconductor layer.

Preferably, the doping concentration of the doped layer is within a range of 1e12~5e15 $cm^{-3}$.

Preferably, the method further comprises: forming an extension ring in the epitaxial semiconductor layer, wherein the extension ring surrounds the second doped region and is spaced from the second doped region, and the extension ring is of the first doping type.

Preferably, the extension ring extends through the doped layer into the epitaxial semiconductor layer by a predetermined depth.

Preferably, the method further comprises forming an isolation structure which extends from the surface of the epitaxial semiconductor layer into the semiconductor substrate for defining the first portion and the second portion of the epitaxial semiconductor layer, after the step of forming the first doped region and the second doped region.

The ESD protection device and the method therefor are provided. The ESD protection device includes a rectifier diode and an open-base bipolar transistor. The second doped region is an additional doped layer which is formed around the emitter region of the open-base bipolar transistor, the doped layer with the second doping type is used for inverting the induced doped region below the interlayer dielectric layer, so that the junction capacitance between the induced doped region and the epitaxial semiconductor layer is decreased. Due to the additional doped region, the junction capacitance of the ESD protection device is increased, so that the response speed is improved.

In a preferable embodiment, the second doped region is an additional extension ring which is formed around the emitter region of the open-base bipolar transistor, the extension ring with the first doping type is used for forming a depleted extension region, so that the junction capacitance between the doped layer and the second doped region is decreased. Due to the additional extension ring, the junction capacitance of the ESD protection device is further decreased, so that the response speed is improved.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Figure 1:
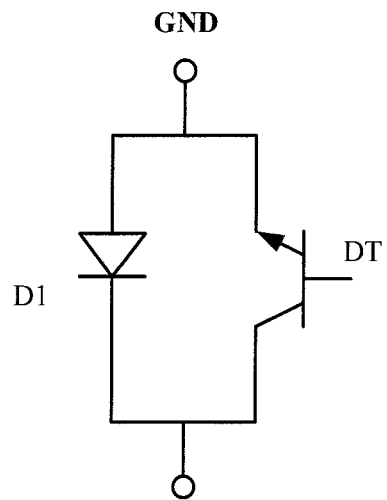
FIG. 1 shows a schematic circuit structure of an ESD protection device.
Figure 2:
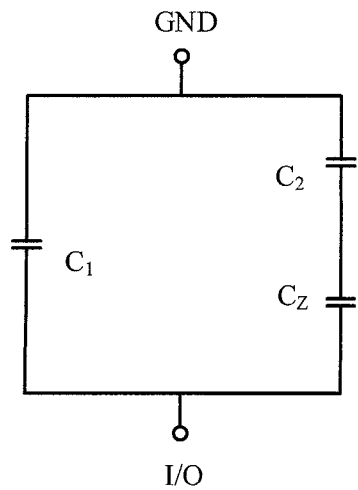
FIG. 2 shows an equivalent circuit of the parasitic capacitance of the ESD protection device shown in FIG. 1.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a doped region of the another region.

In the present application, the term "semiconductor structure" means generally the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Figure 3:
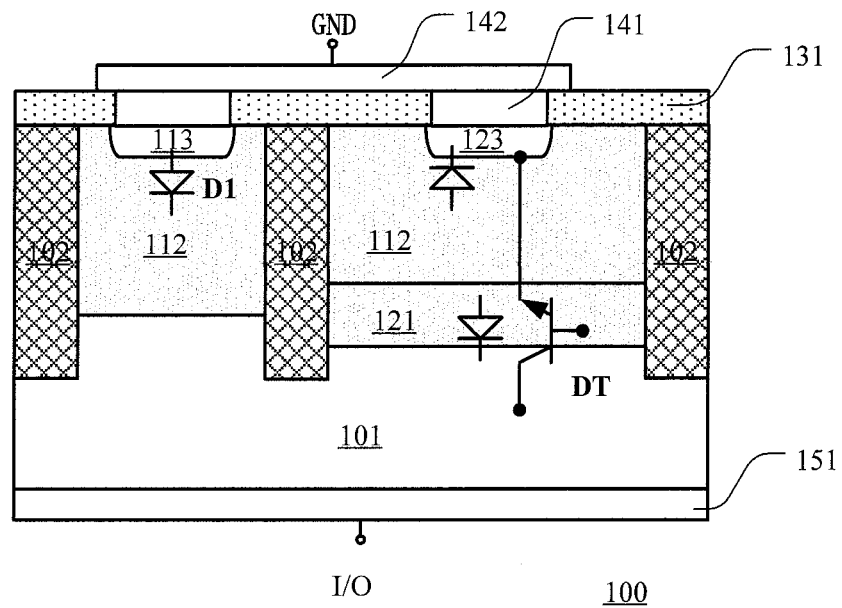
FIGS. 3 to 4 are a cross-sectional diagram of an ESD protection device according to the prior art and an equivalent circuit of the same, respectively.
Figure 4:
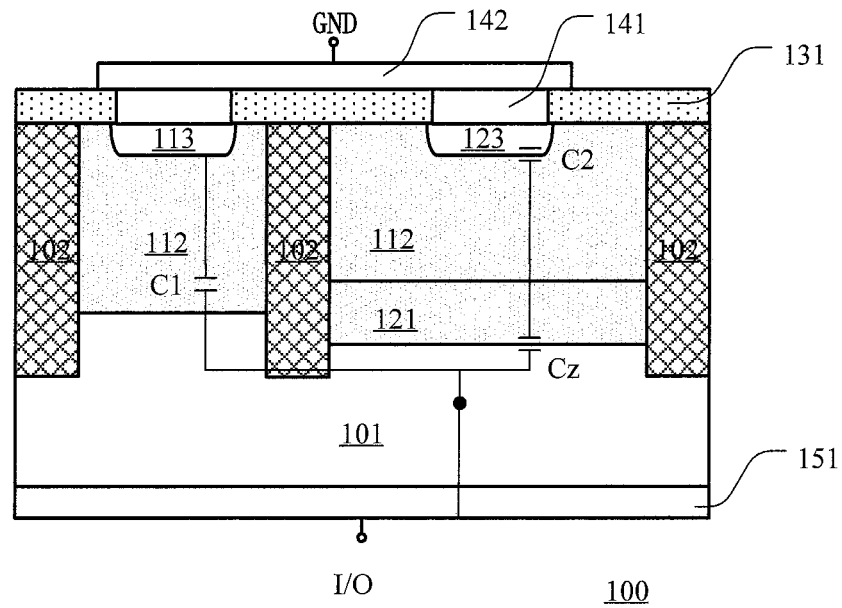

FIGS. 3 to 4 are a cross-sectional diagram of an ESD protection device according to the prior art and an equivalent circuit of the same, respectively.

As shown in FIG. 3, a conventional ESD protection device 100 includes a rectifier diode D1 and an open-base bipolar transistor DT coupled in parallel between the input-output terminal I/O and the ground GND. The input-output terminal I/O is, for example, a terminal of high-speed data port. When the ESD protection device 100 is turned off, the input-output terminal I/O is used to transfer data. When electrostatic charge is released, the open-base bipolar transistor DT is turned on in the direction from the input-output terminal I/O to the ground GND, or the rectifier diode D1 is turned on in the direction from the ground GND to the input-output terminal I/O, thereby providing an electrostatic discharge path.

The ESD protection device 100 includes a semiconductor substrate 101, a buried layer 121 on the semiconductor substrate 101 and an epitaxial semiconductor layer 112 on the semiconductor substrate 101 and the buried layer 121, a first doped region 113 in the epitaxial semiconductor layer 112, and a second doped region 123 in the epitaxial semiconductor layer 112. The semiconductor substrate 101 and the second doped region 123 are both of N-type, and the second doped region 123 is heavily doped. The buried layer 121, the epitaxial semiconductor layer 112 and the first doped region 113 are of P-type, and the first doped region 113 is heavily doped.

In a first region of the semiconductor substrate 101, the semiconductor substrate 101, the epitaxial semiconductor layer 112 and the first doped region 113 constitute the rectifier diode D1, and a first PN junction is formed between the semiconductor substrate 101 and the epitaxial semiconductor layer 112. In the rectifier diode D1, the semiconductor substrate 101 and the epitaxial semiconductor layer 112 are used as a cathode and an anode, respectively.

In a second region of the semiconductor substrate 101, the semiconductor substrate 101, the buried layer 121, the epitaxial semiconductor layer 112 and the second doped region 123 constitute the open-base bipolar transistor DT, a second PN junction is formed between the semiconductor substrate 101 and the buried layer 121, a third PN junction is formed between the epitaxial semiconductor layer 112 and the second doped region 123, and the second and the third PN junctions are reversely biased. The semiconductor substrate 101 and the second doped region 123 are used as a collector region and an emitter region of the open-base bipolar transistor DZ, respectively, and the buried layer 121 and the epitaxial semiconductor layer 112 are used together as a base region of the open-base bipolar transistor DZ.

As referring to FIG. 4, in the ESD protection device 100, the base-emitter junction of the open-base bipolar transistor DT can be equivalent to a rectifier diode, and the base-collector junction can be equivalent to a Zener diode. The parasitic capacitance of the rectifier diode D1 is denoted as C1, the capacitance of the base-emitter junction in the open-base bipolar transistor DT is denoted as C2, and the capacitance of the base-collector junction is denoted as CZ.

Preferably, the ESD protection device 100 further includes an isolation structure 102. In the first region of the semiconductor substrate 101, the isolation structure 102 extends from the surface of the epitaxial semiconductor layer 112 into the semiconductor substrate 101 for defining an active region of the rectifier diode D1. In the second region of the semiconductor substrate 101, the isolation structure 102 extends from the surface of the epitaxial semiconductor layer 112 into the semiconductor substrate 101 for defining an active region of the open-base bipolar transistor DT. In this embodiment, the isolation structure 102 is, for example, an isolating trench, for limiting transverse current.

Preferably, the ESD protection device 100 further includes an interlayer dielectric layer 131 on the epitaxial semiconductor layer 112. A first electrode 142 is formed on the interlayer dielectric layer 131. The first electrode 142 is electrically coupled to the first doped region 113 and the second doped region 123 through the conductive vias 141 across the interlayer dielectric layer 131, so as to couple the first doped region 113 and the second doped region 123 to each other. A second electrode 151 is formed on the surface of the semiconductor substrate 101 opposite to the first electrode 142. The first electrode 142 and the second electrode 151 is made of, for example, a metal material selected from the group consisting of gold, silver and copper, or an alloy thereof.

According to the above embodiment, the rectifier diode D1 and open-base bipolar transistor DT are integrated into one chip. In an alternative embodiment, if the rectifier diode D1 and the open-base bipolar transistor DT form discrete semiconductor devices, respectively, then the two may be electrically coupled to each other by a bonding wire.

For the ESD protection device, it is desirable to increase the area of the PN junction of the open-base bipolar transistor DT and the doping concentration so as to allow a relatively large amount of current to flow through the PN junction during the time period of electrostatic discharge, and thus the electrostatic discharge capacity of the ESD protection device is improved. However, the response speed of the ESD protection device is reduced because the increased area of the PN junction will increase the parasitic capacitance C2. Therefore, it is important to choose the junction area and the doping concentration appropriately in the design process of the device, in order to achieve the ultimate device performance.

Figure 5:
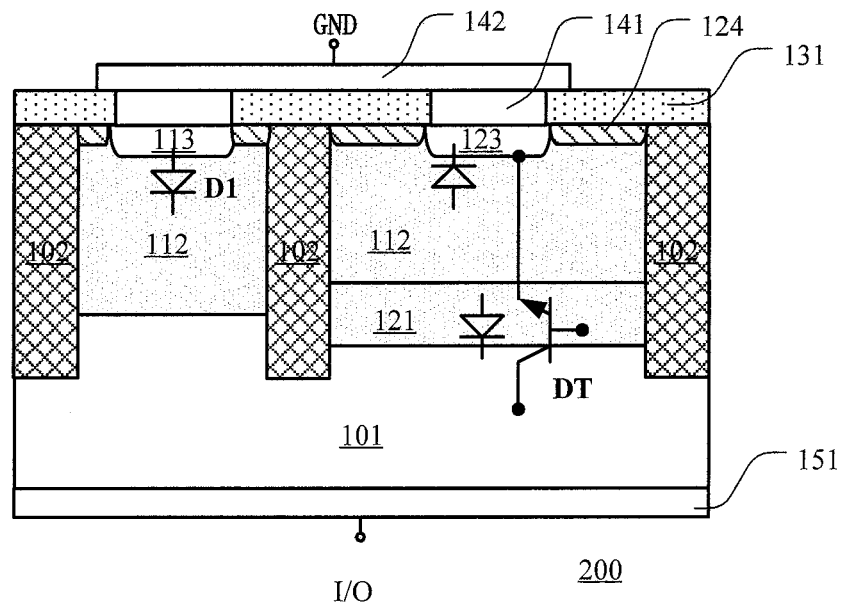
FIGS. 5 to 6 are a cross-sectional diagram of another ESD protection device according to the prior art and an equivalent circuit of the same, respectively.
Figure 6:
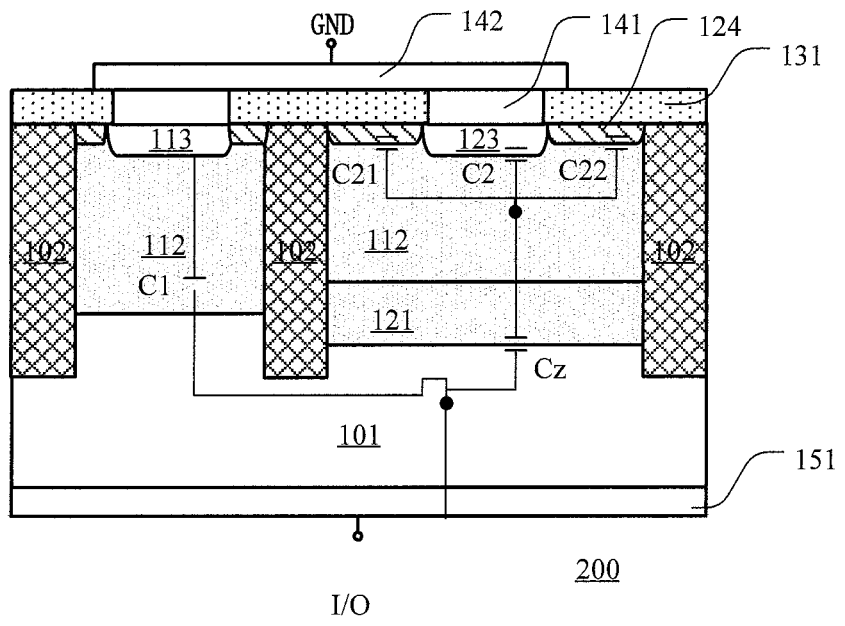

However, because of the charge trapping phenomenon existing in the interlayer dielectric layer 131, the capacitance values of the actual product of the ESD protection device are generally larger than desired values having been designed. FIGS. 5 to 6 are a cross-sectional diagram of another ESD protection device according to the prior art and an equivalent circuit of the same, respectively.

As shown in FIG. 5, the ESD protection device 200 includes the rectifier diode D1 and the open-base bipolar transistor DT. The interlayer dielectric layer 131 usually captures positive charges, and an induced doped region 124 is formed in the surface of the epitaxial semiconductor layer 112 located below the interlayer dielectric layer 131 due to the induction of the interlayer dielectric layer 131. In this case, the induced doped layer 124 is of slightly doped N-type. An additional fourth PN junction is formed between the induced doped layer 124 and the epitaxial semiconductor layer 112 in the open-base bipolar transistor DT. The third PN junction and the fourth PN junction are coupled in parallel and biased in the same direction, so that the junction area of the open-base bipolar transistor DT is significantly increased, thereby increasing the junction capacitance of the open-base bipolar transistor DT.

As referring to FIG. 6, in the ESD protection device 200, the base-emitter junction of the open-base bipolar transistor DT can be equivalent to a rectifier diode, and the base-collector junction can be equivalent to a Zener diode. The parasitic capacitance of the rectifier diode D1 is denoted as C1, the capacitance of the base-emitter junction in the open-base bipolar transistor DT is denoted as C2+C21+C22, and the capacitance of the base-collector junction is denoted as CZ.

Due to charge trapping phenomenon of the interlayer dielectric layer 131, the junction capacitance of the open-base bipolar transistor DT is significantly increased. For the capacitance of the base-emitter junction in the open-base bipolar transistor, the capacitance C2 is a junction capacitance of the above-described third PN junction, the capacitance C21 and C22 are junction capacitances of the above-described fourth PN junction. The capacitance values of the actual product of the ESD protection device 100 is generally larger than desired values having been designed, which reduces the response speed of the ESD protection device.

FIGS. 7a to 7f are cross-sectional diagrams at different steps of the method for manufacturing an ESD protection device according to an embodiment of the present disclosure, respectively. For example, the method is used to manufacture the ESD protection device shown in FIG. 5.

Figure 7A:
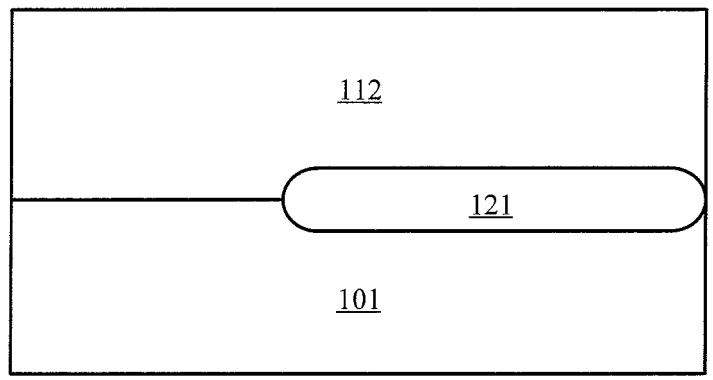
FIGS. 7a to 7f are cross-sectional diagrams at different steps of the method for manufacturing an ESD protection device according to an embodiment of the present disclosure.

As shown in FIG. 7a, the buried layer 121 is formed in the first and second regions which are adjacent to each other in the semiconductor substrate 101. The semiconductor substrate 101 is, for example, a single-crystal substrate and doped to be of N-type. For example, the buried layer 121 is a doped region formed at a predetermined depth below the surface of the semiconductor substrate 101. The buried layer 121 is doped to be of P-type.

A P-type semiconductor layer or region may be formed by implanting a P-type dopant such as B in the semiconductor layer or region. An N-type semiconductor layer or region may be formed by implanting an N-type dopant such as P or As in the semiconductor layer or region. By controlling ion implantation parameters, such as implantation energy and dosage, the doped region may reach a predetermined depth and may have a predetermined doping concentration.

In order to form the buried layer 121 in a selected region of the semiconductor substrate 101, a photoresist mask (not shown) is formed by photolithographic process, where the openings expose the desired area to be implanted. The ion implantation is carried out via the openings of the photoresist mask by conventional ion implantation and flooding techniques to form the buried layer 121. After the ion implantation, the photoresist mask is removed by ashing or dissolving with a solvent.

In the embodiment, the resistivity of the semiconductor substrate 101 is, for example, less than 0.1 ohm-cm, and the doping concentration of the buried layer is, for example, within the range of 2e14 cm−2~5e15 cm−2. In a preferable embodiment, if the doping concentration of the semiconductor substrate 101 is very high, an additional epitaxial semiconductor layer may be formed on the surface of the semiconductor substrate 101 before the buried region 121 is formed, and then the ion implantation is carried out.

In the embodiment, the larger the area size of the buried layer 121, the smaller the clamping voltage of the open-base bipolar transistor DT. Therefore, the area size of the buried layer 121 can be determined in accordance with the operating voltage requirement of the ESD protection device.

Then the epitaxial semiconductor layer is formed on the surface of the buried layer 121 by a known deposition process. The deposition process is, for example, one selected from the group consisting of electron beam evaporation (EBM), chemical vapor deposition (CVD), atomic layer deposition (ALD), and pulsation.

In this embodiment, the epitaxial semiconductor layer 112 is of P-type. It is desirable that the doping concentration of the epitaxial semiconductor layer 112 is as low as possible to make sure that the parasitic capacitance can be reduced as much as possible when the rectifier diode D1 and the open-base bipolar transistor DT are turned on.

In an alternative embodiment, the initial deposited epitaxial semiconductor layer 112 can be un-doped or be of slightly doped N-type. After the epitaxial semiconductor layer 112 is formed, the portion of the epitaxial semiconductor layer 112 on the buried layer 121 is converted into a P-type epitaxial semiconductor layer due to self-doping of the buried layer 121, and the portion at the periphery of the buried layer 121 maintains as an N-type layer or an intrinsic layer, so that the epitaxial semiconductor layer 112 is divided into doped regions of different doping types.

Figure 7B:
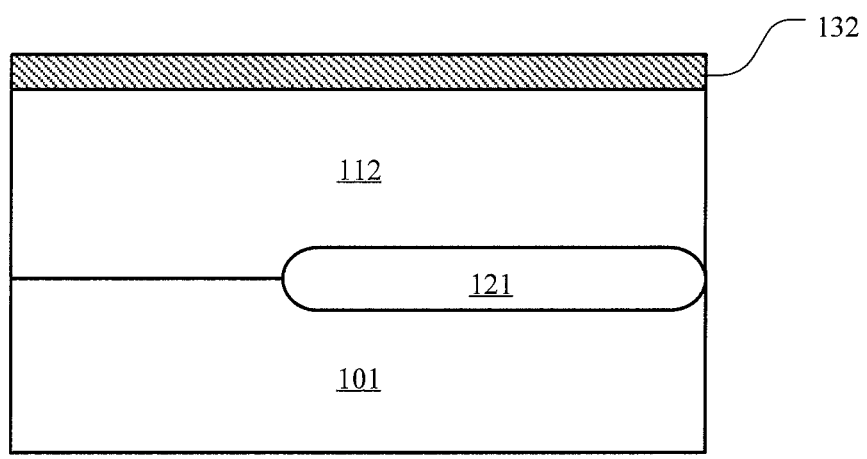

Further, the ion implantation is carried out by conventional ion implantation and flooding techniques to form the doped layer 132 in the epitaxial semiconductor layer 112, as shown in FIG. 7b.

During the ion implantation, the doped layer 132 is used to cover the surface of the semiconductor structure to form a blanket layer instead of using a mask. The doped layer 132 can extend downwards from the surface of the epitaxial semiconductor layer 112 by a predetermined depth. The doped layer 132 is used to suppress the induced doped region formed below the interlayer dielectric layer, so that the depth of the doped layer 132 can be controlled in accordance with the depth of the induced doped region.

The doped layer 132 is for example of P-type. The doping concentration of the doped layer 132, for example, within the range of 1e12~5e15 cm$^{-3}$, is slightly higher than that of the epitaxial semiconductor layer 112. The doping concentration of the doped layer 132 cannot be too low, otherwise the doped region induced by the interlayer dielectric layer cannot be inverted; however the doping concentration of the doped layer 132 cannot be too high, either, otherwise the capacitance of the PN junction formed between the doped layer 132 and the emitter region will be very large, which will thereby increase the junction capacitance of the open-base bipolar transistor DT.

Figure 7C:
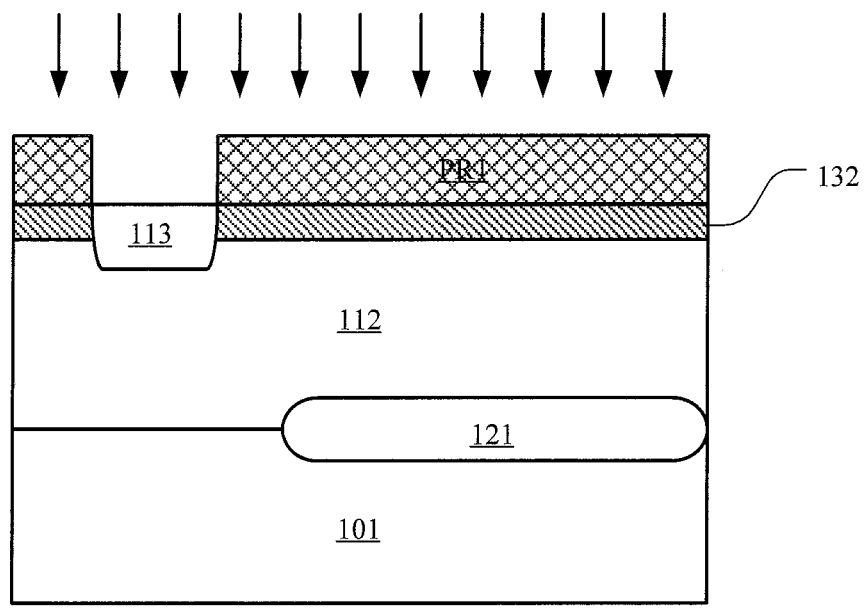

Further, the photoresist mask PR1 is formed by photolithographic process, where the openings expose a portion of the surface of the epitaxial semiconductor layer 112. The ion implantation is carried out via the openings of the photoresist mask by conventional ion implantation and flooding techniques to form the first doped region 113 in the epitaxial semiconductor layer 112, as shown in FIG. 7c. After the ion implantation, the photoresist mask is removed by ashing or dissolving with a solvent.

The first doped region 113 is a heavily doped P-type region extending downwards from the surface of the epitaxial semiconductor layer 112 by a predetermined depth. The first doped region 113 is located above the first region of the semiconductor substrate 101, and the buried layer 121 is not formed in the first region. The first doped region 113 and the epitaxial semiconductor layer 112 form the first PN junction, thereby forming the anode and cathode of the rectifier diode D1, respectively.

Figure 7D:
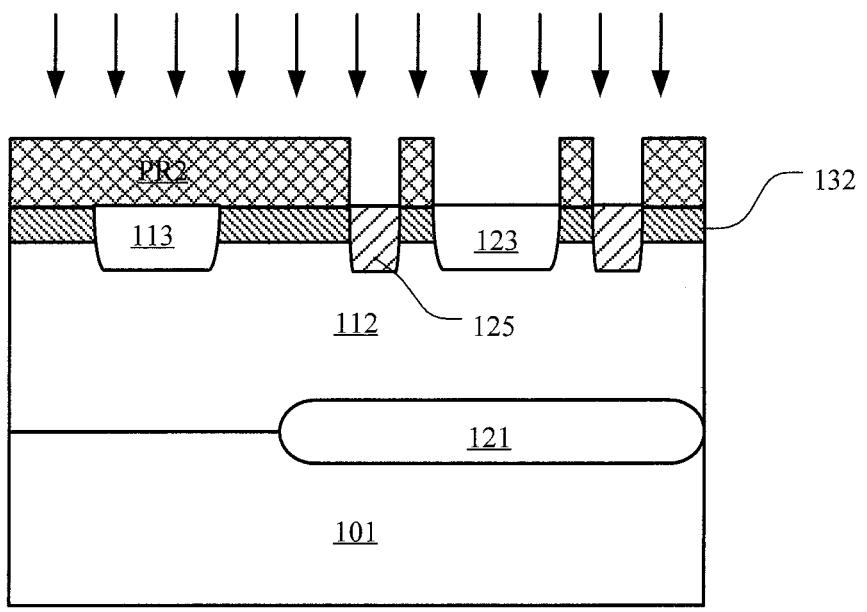

Further, the photoresist mask PR2 is formed by photolithographic process, where the openings expose a portion of the surface of the epitaxial semiconductor layer 112. The ion implantation is carried out via the opening of the photoresist mask by conventional ion implantation and flooding techniques to form the second doped region 123 in the epitaxial semiconductor layer 112, as shown in FIG. 7d. After the ion implantation, the photoresist mask is removed by ashing or dissolving with a solvent.

The second doped region 123 is a heavily doped N-type region extending downwards from the surface of the epitaxial semiconductor layer 112 by a predetermined depth. The second doped region 123 is located above the second region of the semiconductor substrate 101, and the second region is located above the buried layer 121 having been formed. The second PN junction is formed between the semiconductor substrate 101 and the buried layer 121, the third PN junction is formed between the second doped region 123 and the epitaxial semiconductor layer 112. Accordingly, the semiconductor substrate 101 and the second doped region 123 are used as a collector region and an emitter region of the open-base bipolar transistor DT, respectively, and the buried layer 121 and the epitaxial semiconductor layer 112 are used together as a base region of the open-base bipolar transistor DT.

Further, the isolation structure 102 is formed for defining the rectifier diode D1 and the active region of the open-base bipolar transistor DT.

The isolation structure 102 extends from the surface of the epitaxial semiconductor layer 112 into the semiconductor substrate 101 at the periphery of the rectifier diode D1 and the open-base bipolar transistor DT, for isolating the rectifier diode D1 from the open-base bipolar transistor DT in the ESD protection device and for isolating from the adjacent semiconductor devices.

The isolation structure 102 is for example an isolating trench. The process of forming the isolating trench, which, for example, includes a step of etching a shallow trench in a semiconductor structure and filling the shallow trench with insulating materials, is known in the art.

Figure 7E:
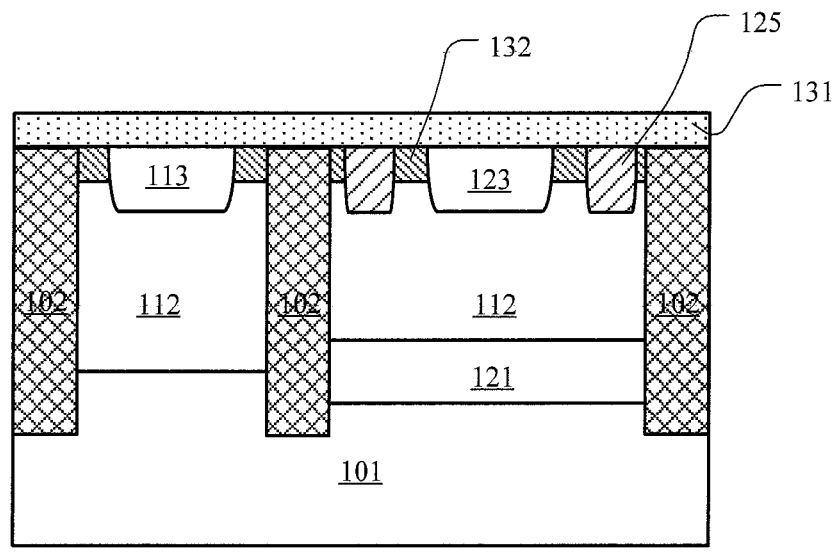

Next, the interlayer dielectric layer 131 is formed on the surface of the doped region 113 by the above conventional deposition processes, as shown in FIG. 7e. For example, the interlayer dielectric layer 131 is made of silicon oxide. In the preferable embodiment, the doped region 113 contacts the interlayer dielectric layer 131. In an alternative embodiment, the doped region 113 may be spaced from the interlayer dielectric layer 131 by a predetermined distance.

An extension ring 125 is formed on one portion of the surface of the epitaxial semiconductor layer 112. The extension ring 125 is of slightly doped N-type. The extension ring 125 is separated from the second doped region 123 and surrounds the second doped region 123.

The second doped region 123 in the open-base bipolar transistor DT is used as an emitter region. Because the second doped region 123 defines the area of the emitter region, the corresponding junction area is approximately the same as the contact area of the second doped region 123 and the epitaxial semiconductor layer 112.

The interlayer dielectric layer 131 usually captures positive charges, and if there is no doped layer 132, an N-type induced doped region would be formed in the epitaxial semiconductor layer 112 below the interlayer dielectric layer 132. However, in the ESD protection device according to this embodiment, the doped layer 132 is formed in advance below the interlayer dielectric layer 131. The depth and doping concentration of the doped layer 132 are determined by the corresponding parameters of the induced doped region such that the doped layer 132 inverts the induced doped region into P-type, to suppress the induced doped region below the interlayer dielectric layer. The doped layer 132 avoids the formation of the induced doped region and the formation of the fourth PN junction between the induced doped region and the epitaxial semiconductor layer, and further avoids the generation of the junction capacitances C21 and C22 relevant to the fourth PN junction. Therefore, the actual product of the open-base bipolar transistor DT has a parasitic capacitance value consistent to the designed capacitance value such that the ESD protection device can maintain a high response speed.

Further, if the doped layer 132 is, for example, of P-type, it still forms a fifth PN junction with the N-type second doped region 123. Although the junction capacitance of the fifth PN junction is greatly less than that of the fourth PN junction, it still contributes to the parasitic capacitance of the open-base bipolar transistor DT. In the above preferable embodiment, the extension ring 125 can be formed around the second doped region 123 to form a depleted extension region.

Figure 8:
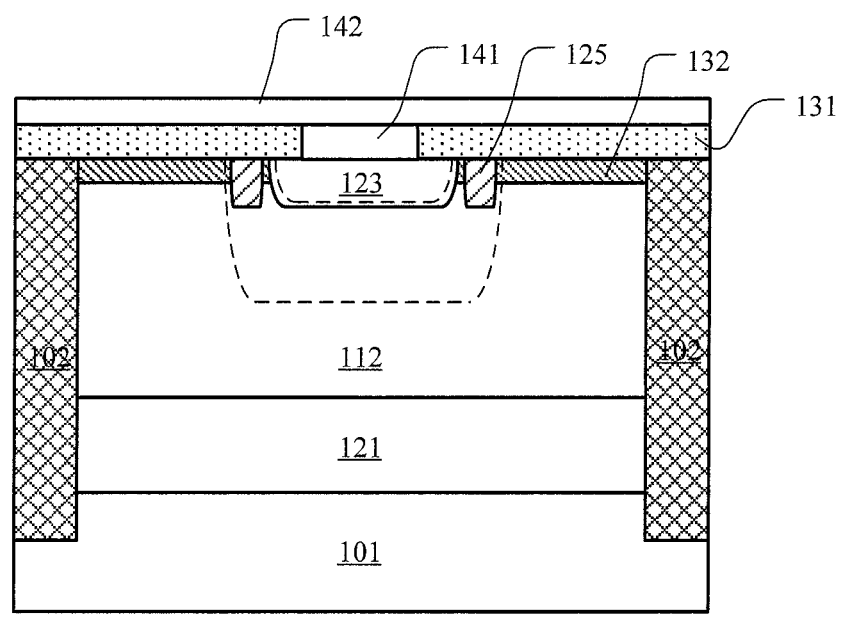
FIGS. 8 and 9 are schematic diagrams of the portions of the ESD protection device including and without an extension ring, respectively.
Figure 9:
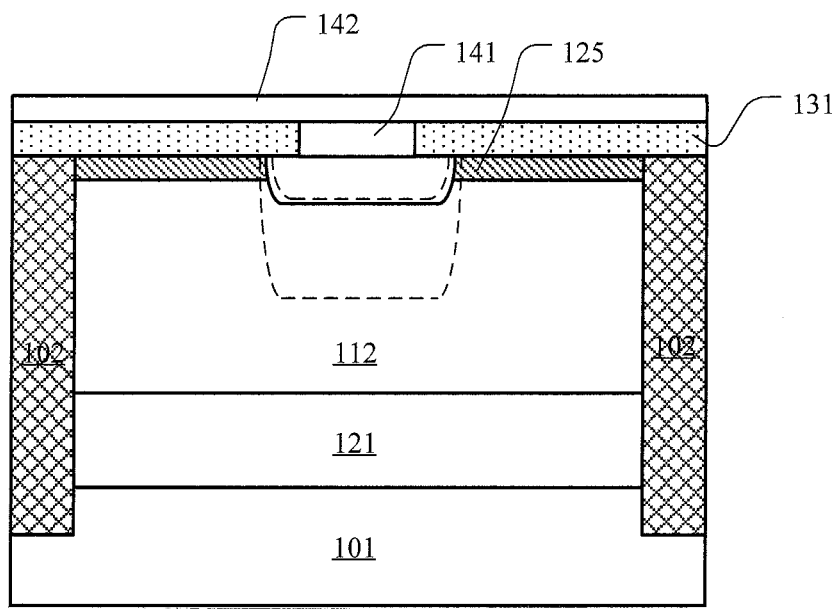

FIGS. 8 to 9 are schematic diagrams of the portions of the ESD protection device respectively including an extension ring and without the extension ring, the dashed line represents the boundary of the depleted extension region. Only the relevant structures to the open-base bipolar transistor is shown in the figures, so that the rectifier diode is not shown. It can be understood that the junction capacitance of the fifth PN junction can be decreased by the depleted extension region.

Further, the openings, which are formed in the interlayer dielectric layer 131 by photolithography and etching, reach the first doped region 113 and the second doped region 123, respectively.

Figure 7F:
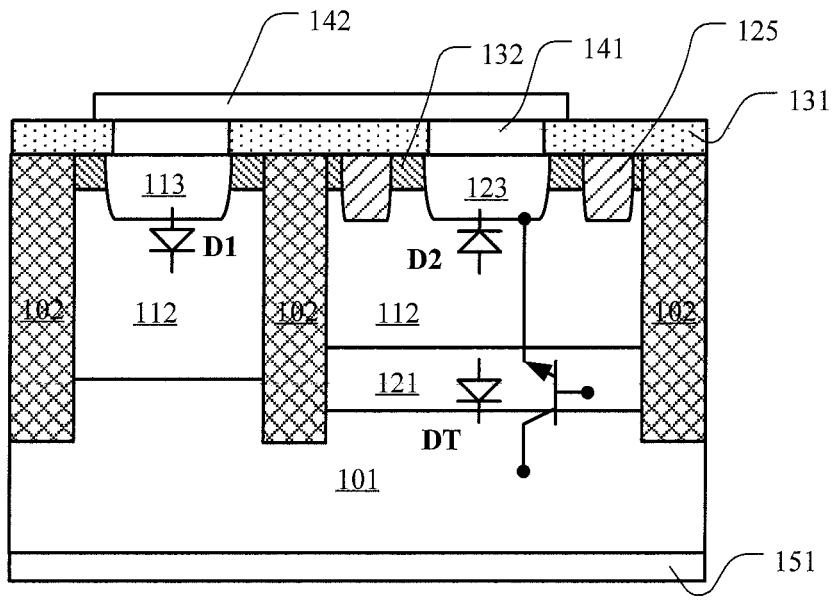

Then, as shown in FIG. 7f, the conductive vias 141 are formed in the openings of the interlayer dielectric layer 131 by the above known deposition process and planarization process (e.g., chemical mechanical planarization), the first electrode 142 is formed on the surface of the interlayer dielectric layer 131, and the second electrode 151 is formed on the surface of the semiconductor substrate 101 opposite to the epitaxial semiconductor layer 112. The conductive vias 141, the first electrode 142 and the second electrode 151 are made of, for example, a metal material selected from the group consisting of gold, silver and copper.

According to the above embodiments, the manufacturing method for integrating the rectifier diode and the open-base bipolar transistor into one chip has been described. In an alternative embodiment, the method may be used to manufacture the rectifier diode and the open-base bipolar transistor separately, thereby forming two separate discrete devices which will then be coupled with each other by a bonding wire to form an ESD protection device. The above method for defining the emitter region of the open-base bipolar transistor can also be used to manufacture discrete devices of the open base-bipolar transistor. In another alternative embodiment, the open-base bipolar transistor may be used alone as a unilateral ESD protection device. Thus, the method for manufacturing an ESD protection device according to the embodiment of the present disclosure can also be used to manufacture an ESD protection device only including a base bipolar transistor.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to the element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. An ESD protection device, comprising:
a semiconductor substrate with a first doping type;
a buried layer, a surface of which is at least exposed on a surface of said semiconductor substrate, wherein said buried layer is of a second doping type opposite to said first doping type;
an epitaxial semiconductor layer located on said semiconductor substrate and said buried layer, and being spaced apart into a first portion and a second portion, wherein said first portion of said epitaxial semiconductor layer is of one of said first doping type and said second doping type, said second portion is of said second doping type;
a first doped region located in said first portion of said epitaxial semiconductor layer, wherein said first doped region is of said second doping type;
a second doped region located in said second portion of said epitaxial semiconductor layer, wherein said second doped region is of said first doping type; and
a doped layer located around said second doped region, wherein said doped layer is of said second doping type,
said ESD protection device comprises a rectifier diode and an open-base bipolar transistor, said first doped region is an anode of said rectifier diode and said semiconductor substrate is a cathode of said rectifier diode, said second doped region, said epitaxial semiconductor layer and said semiconductor substrate are an emitter region, a base region and a collector region of said open-base bipolar transistor, respectively,
said first doped region and said second doped region extend through said doped layer into said epitaxial semiconductor layer by a predetermined depth.

2. The ESD protection device according to claim 1, wherein said first portion of said epitaxial semiconductor layer contacts said surface of said semiconductor substrate, and said second portion of said semiconductor layer contacts said surface of said buried layer.

3. The ESD protection device according to claim 1, wherein said first portion of said epitaxial semiconductor layer is of said first doping type, and said cathode of said rectifier diode comprises said first portion of said epitaxial semiconductor layer.

4. The ESD protection device according to claim 1, wherein said first portion of said epitaxial semiconductor layer is of said second doping type, and said anode of said rectifier diode comprises said first portion of said epitaxial semiconductor layer.

5. The ESD protection device according to claim 1, wherein said base region of said open-base bipolar transistor further comprises said buried layer.

6. The ESD protection device according to claim 1, further comprising: an interlayer dielectric layer on said doped layer.

7. The ESD protection device according to claim 6, wherein said doped layer contacts said interlayer dielectric layer.

8. The ESD protection device according to claim 6, wherein said doped layer has a doping concentration higher than that of said epitaxial semiconductor layer.

9. The ESD protection device according to claim 8, wherein said doping concentration of said doped layer is within a range of 1e12~5e15 $cm^{-3}$.

10. The ESD protection device according to claim 6, further comprising: an extension ring with said first doping type surrounding said second doped region and being spaced from said second doped region.

11. The ESD protection device according to claim 10, wherein said extension ring extends through said doped layer into said epitaxial semiconductor layer by a predetermined depth.

12. The ESD protection device according to claim 1, further comprising: an isolation structure which extends from a surface of said epitaxial semiconductor layer into said semiconductor substrate so as to divide said epitaxial semiconductor layer into said first portion and said second portion.

13. The ESD protection device according to claim 12, wherein said isolation structure is a doped region with said first doping type or an isolating trench.

14. The ESD protection device according to claim 1, wherein said first doping type is one of N-type and P-type, and said second doping type is the other of N-type and p-type.

15. A method for manufacturing an ESD protection device, comprising:
    forming a buried layer in said semiconductor substrate, wherein a surface of said buried layer is at least exposed on a surface of said semiconductor substrate, and said semiconductor substrate and said buried layer are respectively of a first doping type and a second doping type, said first doping type is opposite to said second doping type;
    forming an epitaxial semiconductor layer on said semiconductor substrate and said buried layer, wherein a first portion of said epitaxial semiconductor layer is one of said first doping type and said second doping type, and a second portion of said epitaxial semiconductor layer is of said second doping type;
    forming a first doped region in said first portion of said epitaxial semiconductor layer, wherein said first doped region is of said second doping type;
    forming a second doped region in said second portion of said epitaxial semiconductor layer, wherein said second doped region is of said first doping type;
    spacing said first portion and said second portion of said epitaxial semiconductor layer from each other; and
    forming a doped layer around said epitaxial semiconductor layer, wherein said doped layer is located around said second doped region and is of said second doping type,
    wherein said ESD protection device comprises a rectifier diode and an open-base bipolar transistor, said first doped region is an anode of said rectifier diode and said semiconductor substrate is a cathode of said rectifier diode, said second doped region, said epitaxial semiconductor layer and said semiconductor substrate are an emitter region, a base region and a collector region of said open-base bipolar transistor, respectively,
    said first doped region and said second doped region extend through said doped layer into said epitaxial semiconductor layer by a predetermined depth.

16. The method according to claim 15, wherein said step of forming said epitaxial semiconductor layer comprises:
    forming said epitaxial semiconductor layer with said second doping type by epitaxial growth.

17. The method according to claim 15, wherein said step of forming said epitaxial semiconductor layer comprises:
    forming said epitaxial semiconductor layer with said first doping type by epitaxial growth; and
    self-doping said second portion of said epitaxial semiconductor layer by using said buried layer so as to convert said second portion of said epitaxial semiconductor layer into said second doping type.

18. The method according to claim 15, further comprising: forming an interlayer dielectric layer on said doped layer.

19. The method according to claim 18, wherein said doped layer contacts said interlayer dielectric layer.

20. The method according to claim 18, wherein said doped layer has a doping concentration higher than that of said epitaxial semiconductor layer.

21. The method according to claim 20, wherein said doping concentration of said doped layer is within a range of $1e12 \sim 5e15$ cm$^{-3}$.

22. The method according to claim 15, further comprising:
    forming an extension ring in said epitaxial semiconductor layer, wherein said extension ring surrounds said second doped region and is spaced from said second doped region, and said extension ring is of said first doping type.

23. The method according to claim 22, wherein said extension ring extends through said doped layer into said epitaxial semiconductor layer by a predetermined depth.

24. The method according to claim 15, further comprising:
    forming an isolation structure which extends from a surface of said epitaxial semiconductor layer into said semiconductor substrate for defining said first portion and said second portion of said epitaxial semiconductor layer, after said steps of forming said first doped region and said second doped region.

* * * * *